US007937824B2

(12) United States Patent
Taguchi

(10) Patent No.: US 7,937,824 B2
(45) Date of Patent: May 10, 2011

(54) METHOD FOR MANUFACTURING NONRECIPROCAL CIRCUIT DEVICE AND METHOD FOR MANUFACTURING COMPOSITE ELECTRONIC COMPONENT

(75) Inventor: Yoshinori Taguchi, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/416,209

(22) Filed: Apr. 1, 2009

(65) Prior Publication Data

US 2009/0293272 A1 Dec. 3, 2009

(30) Foreign Application Priority Data

May 27, 2008 (JP) ................................ 2008-137980

(51) Int. Cl.
*H01P 11/00* (2006.01)
*H01Q 13/00* (2006.01)
*H01Q 17/00* (2006.01)
*H01S 4/00* (2006.01)
*H01L 23/48* (2006.01)
*H01L 21/00* (2006.01)

(52) U.S. Cl. ........... 29/600; 29/601; 29/592.1; 257/688; 438/117

(58) Field of Classification Search .................... 29/840, 29/600, 601, 592.1; 257/688, 689, 690; 438/117
See application file for complete search history.

(56) References Cited

U.S. PATENT DOCUMENTS

| | | | | |
|---|---|---|---|---|
| 3,705,994 | A * | 12/1972 | Berry, Jr. | 310/91 |
| 6,829,816 | B2 | 12/2004 | Nakagawa et al. | |
| 2002/0008596 | A1 | 1/2002 | Watanabe et al. | |
| 2002/0079981 | A1 | 6/2002 | Tanaka | |
| 2003/0233750 | A1 * | 12/2003 | Pham-Van-Diep et al. | 29/840 |

FOREIGN PATENT DOCUMENTS

| | | | |
|---|---|---|---|
| JP | 05-082110 | U | 11/1993 |
| JP | 11-103203 | A | 4/1999 |
| JP | 2001-345604 | A | 12/2001 |
| JP | 2002-076711 | A | 3/2002 |
| JP | 2002-299914 | A | 10/2002 |
| JP | 2005-117500 | * | 4/2005 |
| JP | 2005-117500 | A | 4/2005 |
| JP | 2005-167581 | A | 6/2005 |
| JP | 2008-092147 | A | 4/2008 |

OTHER PUBLICATIONS

Official Communication issued in corresponding Japanese Patent Application No. 2008-137980, mailed on Apr. 13, 2010.

* cited by examiner

*Primary Examiner* — A. Dexter Tugbang
*Assistant Examiner* — David P Angwin
(74) *Attorney, Agent, or Firm* — Keating & Bennett, LLP

(57) ABSTRACT

A method for manufacturing a nonreciprocal circuit device in which a ferrite-magnet device including ferrite having first and second center electrodes arranged to intersect and be electrically insulated from each other and a pair of permanent magnets fixed to both principal surfaces of the ferrite so as to apply a direct current magnetic field to the ferrite is solder-bonded to a surface of a substrate. The ferrite-magnet device is solder-bonded to the surface of the substrate while a magnetic plate is disposed on a back surface of the substrate.

5 Claims, 14 Drawing Sheets

METHOD FOR MANUFACTURING NONRECIPROCAL CIRCUIT DEVICE AND METHOD FOR MANUFACTURING COMPOSITE ELECTRONIC COMPONENT

BACKGROUND OF THE INVENTION

1. Field of the Invention

The present invention relates to a method for manufacturing a nonreciprocal circuit device, and in particular, to a nonreciprocal circuit device, e.g., an isolator or a circulator, which is used in a microwave band and a method for manufacturing a composite electronic component including the nonreciprocal circuit device.

2. Description of the Related Art

Nonreciprocal circuit devices, e.g., isolators and circulators, have a characteristic that signals are transmitted in a predetermined specific direction and are not transmitted in the reverse direction. For example, the isolator is used in transmitting circuit portions of mobile communication equipment, e.g., automobile telephones and cellular phones, by taking advantage of this characteristic.

Generally, this type of nonreciprocal circuit device includes a ferrite-magnet device made of ferrite provided with a center electrode and a permanent magnet arranged to apply a direct current magnetic field thereto and a predetermined matching circuit device defined by a resistance and a capacitor. Furthermore, a composite electronic component including a plurality of nonreciprocal circuit devices or a composite electronic component including a nonreciprocal circuit device and a power amplifier device, for example, have been provided as modules.

The above-described ferrite-magnet device is typically bonded (for example, via reflow soldering) to a surface of a substrate after the magnetic force of the permanent magnet is measured and adjusted (see, for example, Japanese Unexamined Patent Application Publication No. 2002-299914 and Japanese Unexamined Patent Application Publication No. 2005-117500). Therefore, a leakage magnetic flux of the permanent magnet which has already been magnetized tends to attract or repel other devices which are bonded to the surface of the substrate at the same time and which have magnetic portions. Consequently, a large distance is required between the ferrite-magnet device and other devices. Thus, there is a problem in that the size of a nonreciprocal circuit device or a composite electronic component provided with the ferrite-magnet device is large, and cannot be sufficiently reduced.

SUMMARY OF THE INVENTION

To overcome the problems described above, preferred embodiments of the present invention provide a method for manufacturing a nonreciprocal circuit device and a method for manufacturing a composite electronic component, the methods being capable of eliminating an influence by the magnetic force of a permanent magnet of a ferrite-magnet device so as to facilitate miniaturization.

According to a preferred embodiment of the present invention, a method for manufacturing a nonreciprocal circuit device in which a ferrite-magnet device including ferrite having a plurality of center electrodes arranged to intersect and be electrically insulated from each other and a permanent magnet fixed to a principal surface of the ferrite to apply a direct current magnetic field to the ferrite is bonded to a surface of a substrate, includes the step of bonding the above-described ferrite-magnet device to the surface of the substrate while a plate made of a magnetic material is disposed on a back surface of the above-described substrate.

According to a preferred embodiment of the present invention, a method for manufacturing a composite electronic component in which a ferrite-magnet device including ferrite having a plurality of center electrodes arranged to intersect and be electrically insulated from each other and a permanent magnet fixed to a principal surface of the ferrite to apply a direct current magnetic field to the ferrite and other electronic devices are bonded to a surface of a substrate, includes the step of bonding the above-described ferrite-magnet device and the other electronic devices to the surface of the substrate while a plate made of a magnetic material is disposed on the back surface of the above-described substrate.

In the above-described manufacturing methods, the plate made of a magnetic material is disposed on the back surface of the substrate during the mounting in which the ferrite-magnet device is bonded to the surface of the substrate. Therefore, a leakage magnetic flux of the permanent magnet which has already been magnetized is concentrated on the plate. Consequently, magnetic interference with the other devices which are arranged around the ferrite-magnet device and which are bonded at the same time is greatly reduced, such that the occurrence of deviations in the arrangement of the other devices during the bonding is reduced. Thus, the other devices can be arranged in closer vicinity of the ferrite-magnet device, and the size of a nonreciprocal circuit device or a composite electronic component including the plate can be reduced.

The above-described other devices preferably refer to, for example, matching circuit devices, e.g., capacitors and resistances, defining the nonreciprocal circuit device, other ferrite-magnet devices arranged nearby on the mother substrate, and electronic devices, e.g., power amplifiers, in the composite electronic component.

According to various preferred embodiments of the present invention, an influence of the magnetic force of a permanent magnet defining a ferrite-magnet device is reduced during mounting and miniaturization of a nonreciprocal circuit device and a composite electronic component can be facilitated.

Other features, elements, characteristics and advantages of the present invention will become more apparent from the following detailed description of preferred embodiments of the present invention with reference to the attached drawings.

BRIEF DESCRIPTION OF THE DRAWINGS

FIG. 7A shows an example according to related art, and FIG. 7B shows an example according to a preferred embodiment of the present invention.

FIG. 8A shows an example according to related art, and FIG. 8B shows an example according to a preferred embodiment of the present invention.

FIG. 9A shows an example according to related art, and FIG. 9B shows an example according to a preferred embodiment of the present invention.

DETAILED DESCRIPTION OF PREFERRED EMBODIMENTS

Figure 1:
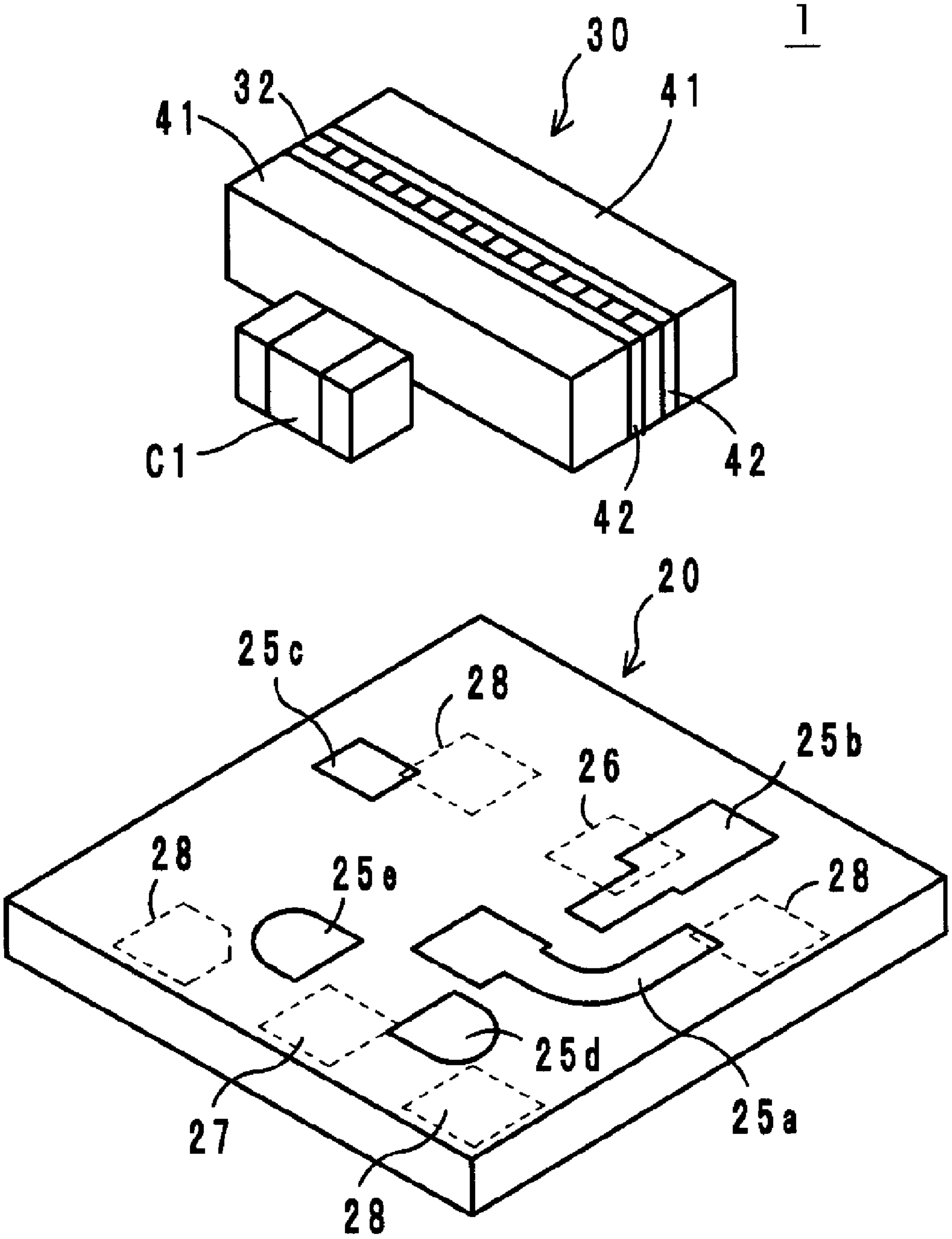
FIG. 1 is an exploded perspective view showing a nonreciprocal circuit device (two-port type isolator) according to a first preferred embodiment of the present invention.

Examples of a method for manufacturing a nonreciprocal circuit device and a method for manufacturing a composite electronic component according to preferred embodiments of the present invention will be described below with reference to attached drawings. Components and elements that are common to the individual preferred embodiments are indicated by the same reference numerals and explanations thereof are not repeated hereafter.

First Preferred Embodiment

FIG. 1 is an exploded perspective view of a two-port type isolator 1 in a first preferred embodiment of the present invention. This two-port type isolator 1 is a lumped-constant isolator and includes a substrate 20, a ferrite-magnet device 30 composed of ferrite 32, and a pair of permanent magnets 41, and a capacitor C1 defining a portion of a matching circuit device.

Figure 2:
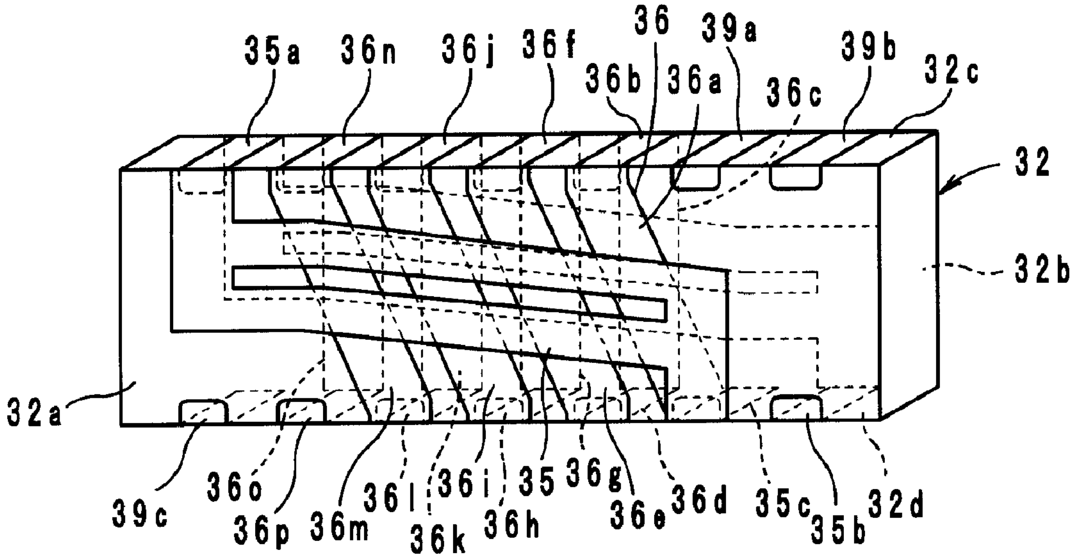
FIG. 2 is a perspective view showing a ferrite with center electrodes.

As shown in FIG. 2, the ferrite 32 is provided with a first center electrode 35 and a second center electrode 36 electrically insulated from each other on front and back principal surfaces 32*a* and 32*b*. Here, the ferrite 32 preferably has a substantially rectangular shape having a first principal surface 32*a* and a second principal surface 32*b* opposite and parallel or substantially parallel to each other.

Figure 4:
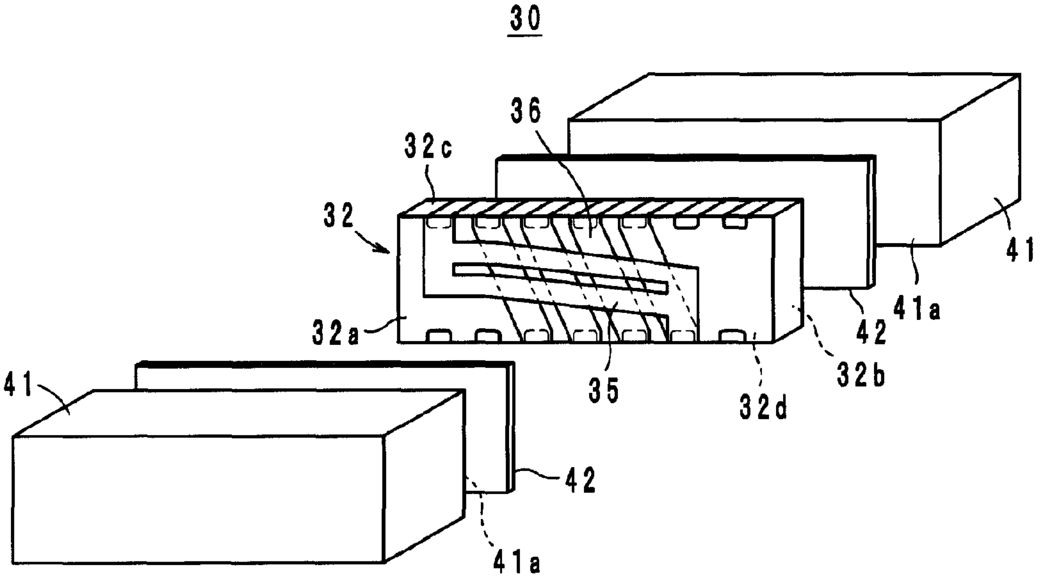
FIG. 4 is an exploded perspective view showing a ferrite-magnet device.

The permanent magnets 41 are preferably bonded to the principal surfaces 32*a* and 32*b* with, for example, an epoxy adhesive 42 therebetween so as to apply a direct current magnetic field to the ferrite 32 in a direction substantially perpendicular to the principal surfaces 32*a* and 32*b* (refer to FIG. 4), so that the ferrite-magnet device 30 is provided. Principal surfaces 41*a* of the permanent magnets 41 have the same or substantially the same dimensions as those of the principal surfaces 32*a* and 32*b* of the above-described ferrite 32. The principal surfaces 32*a* and 41*a* are arranged to oppose each other and the principal surfaces 32*b* and 41*a* are arranged to oppose each other such that the arrangements of the principal surfaces correspond to each other.

The first center electrode 35 is made of a conductive film. That is, as shown in FIG. 2, the first center electrode 35 rises from the lower right on the first principal surface 32*a* of the ferrite 32, branches into two portions that are inclined toward the upper left direction at a relatively small angle relative to a long side, rises to the upper left, extends to the second principal surface 32*b* through a relay electrode 35*a* on an upper surface 32*c*, and branches into two portions on the second principal surface 32*b* so as to be superimposed with the two portions on the first principal surface 32*a* when viewed through the ferrite 32, while one end thereof is connected to a connection electrode 35*b* disposed on a lower surface 32*d*. Furthermore, the other end of the first center electrode 35 is connected to a connection electrode 35*c* disposed on the lower surface 32*d*. In this manner, the first center electrode 35 is wound about 1 turn around the ferrite 32. The first center electrode 35 and the second center electrode 36 described below intersect each while they are insulated from each other by an insulating film that is disposed therebetween. The intersection angle of the center electrodes 35 and 36 is set as necessary, and the input impedance and the insertion loss are adjusted based on the intersection angle.

The second center electrode 36 is made a conductive film. The first half 36*a* of the first turn of the second center electrode 36 is inclined from the lower right to the upper left on the first principal surface 32*a* at a relatively large angle relative to a long side, intersects the first center electrode 35, and extends to the second principal surface 32*b* through a relay electrode 36*b* on the upper surface 32*c*. The second half 36*c* of the first turn is arranged on the second principal surface 32*b* substantially vertically while intersecting the first center electrode 35. The lower end portion of the second half 36*c* of the first turn extends to the first principal surface 32*a* through a relay electrode 36*d* on the lower surface 32*d*. The first half 36*e* of the second turn is arranged parallel or substantially parallel to the first half 36*a* of the first turn on the first principal surface 32*a*, intersects the first center electrode 35, and extends to the second principal surface 32*b* through a relay electrode 36*f* on the upper surface 32*c*. In a manner similar to that described above, the second half 36*g* of the second turn, a relay electrode 36*h*, the first half 36*i* of the third turn, a relay electrode 36*j*, the second half 36*k* of the third turn, a relay electrode 36*l*, the first half 36*m* of the fourth turn, a relay electrode 36*n*, and the second half 36*o* of the fourth turn are disposed on the surfaces of the ferrite 32. Furthermore, the two end portions of the second center electrode 36 are connected to connection electrodes 35*c* and 36*p*, respectively, disposed on the lower surface 32*d* of the ferrite 32. The connection electrode 35*c* is shared while defining connection electrodes of individual end portions of the first center electrode 35 and the second center electrode 36.

Figure 3:
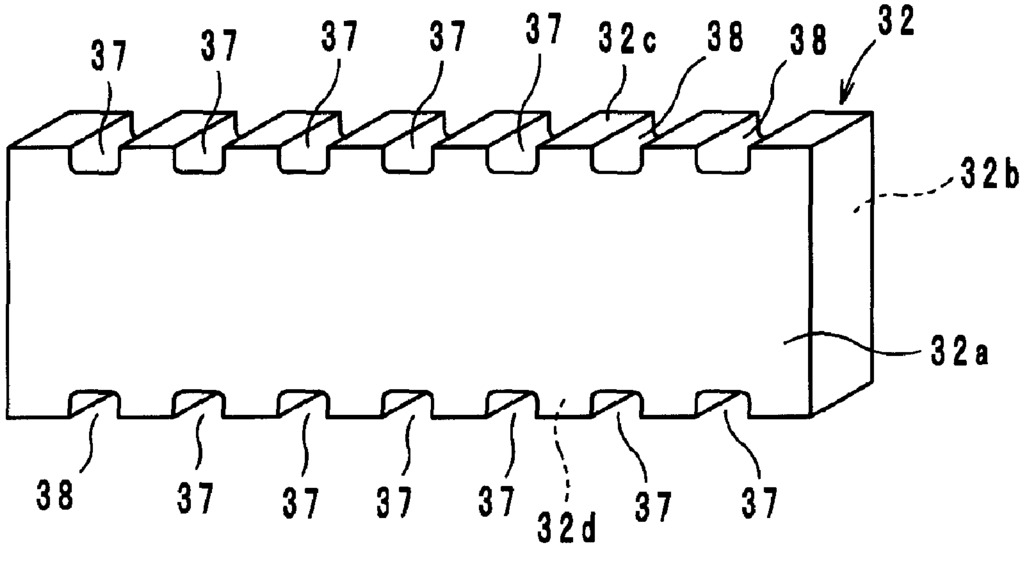
FIG. 3 is a perspective view showing an element assembly of the above-described ferrite.

The connection electrodes 35*b*, 35*c*, and 36*p* and the relay electrodes 35*a*, 36*b*, 36*d*, 36*f*, 36*h*, 36*j*, 36*l*, and 36*n* are formed by applying or filling an electrode conductor, e.g., silver, a silver alloy, copper, or a copper alloy, into concave portions 37 (see FIG. 3) disposed in the upper and lower surfaces 32*c* and 32*d* of the ferrite 32. Moreover, dummy concave portions 38 are also arranged parallel or substantially parallel to the various electrodes in the upper and lower surfaces 32*c* and 32*d*. In addition, dummy electrodes 39*a*, 39*b*, and 39*c* are provided. This type of electrode is formed by forming through holes in a mother ferrite substrate in advance, filling the through holes with the electrode conductor and, thereafter, performing cutting at locations suitable for dividing the through holes. The various electrodes may be formed as conductor films in the concave portions 37 and 38.

YIG ferrite or other suitable ferrite material, for example, is preferably used for the ferrite 32. The first and second center electrodes 35 and 36 and various electrodes can preferably be formed as thick films or thin films of silver or a silver alloy, for example, by a method of printing, transfer, or photolithography, for example. A dielectric thick film of glass, alumina, or other suitable thick film material or a resin film of polyimide or other suitable resin film can preferably be used for the insulating film of the center electrodes 35 and 36. These can also be formed by the method of printing, transfer, or photolithography, for example.

The ferrite 32 can be integrally fired with the insulating film and various electrodes by using a magnetic material. In this case, Pd, Ag, or Pd/Ag, for example, which endures high temperature firing, is preferably used for the various electrodes.

Preferably, a strontium based, a barium based, or a lanthanum-cobalt based ferrite magnet, for example, is used for the permanent magnets 41. Preferably, a one-component thermosetting epoxy adhesive, for example, is used for the adhesive 42 for bonding the permanent magnets 41 and the ferrite 32.

The substrate 20 is a LTCC ceramic substrate, and on the surface thereof, terminal electrodes 25*a*, 25*b*, 25*c*, 25*d*, and 25*e* arranged to mount the above-described ferrite-magnet device 30 and the chip type capacitor C1 which is a component of the matching circuit device, input and output electrodes 26 and 27, and a ground electrode 28 are disposed. Furthermore, matching circuit devices (capacitors C2, CS1, and CS2 and resistance R) which will be described below with reference to FIG. 5 are provided as internal electrodes, and a predetermined circuit is provided through via hole conductors, for example.

The above-described ferrite-magnet device 30 is disposed on the substrate 20, and the electrodes 35*b*, 35*c*, and 36*p* on the lower surface 32*d* of the ferrite 32 are reflow-soldered to the terminal electrodes 25*a*, 25*b*, and 25*c* on the substrate 20 so as to be integrated. In addition, the lower surface of the permanent magnet 41 is integrated on the substrate 20 preferably with an adhesive, for example. Moreover, the capacitor C1 is reflow-soldered to the terminal electrodes 25*d* and 25*e*.

Circuit Configuration

Figure 5:
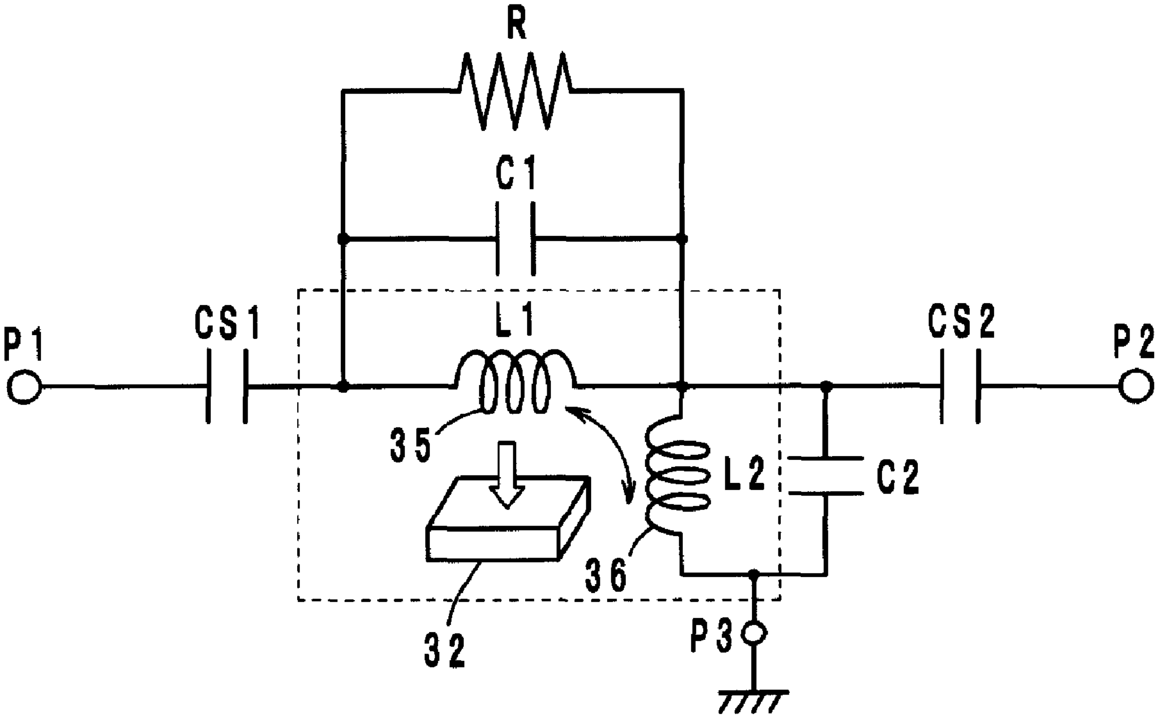
FIG. 5 is an equivalent circuit diagram showing an example of circuits of a two-port type isolator.

FIG. 5 is an equivalent circuit diagram showing an example of circuits of the above-described isolator 1. An input port P1 is connected to the matching capacitor C1 and the terminating resistor R through the matching capacitor CS1, and the matching capacitor CS1 is connected to one end of the first center electrode 35. The other end of the first center electrode 35 and one end of the second center electrode 36 are connected to the terminating resistor R and the capacitors C1 and C2 and are connected to an output port P2 through the capacitor CS2. The other end of the second center electrode 36 and the capacitor C2 are connected to a ground port P3.

In the two-port type isolator 1 defined by the above-described equivalent circuit, one end of the first center electrode 35 is connected to the input port P1, the other end is connected to the output port P2, one end of the second center electrode 36 is connected to the output port P2, and the other end is connected to the ground port P3. Therefore, a two-port type lumped-constant isolator having a small insertion loss can be produced. Furthermore, during operation, a large high frequency current passes through the second center electrode 36 and substantially no high frequency current passes through the first center electrode 35.

Moreover, in the ferrite-magnet device 30, the ferrite and a pair of permanent magnets 41 are integrated preferably with an adhesive 42, for example, so as to be mechanically stable and, therefore, a rugged isolator which is not deformed or broken by vibrations and impacts is produced.

Production Process

Figure 6:
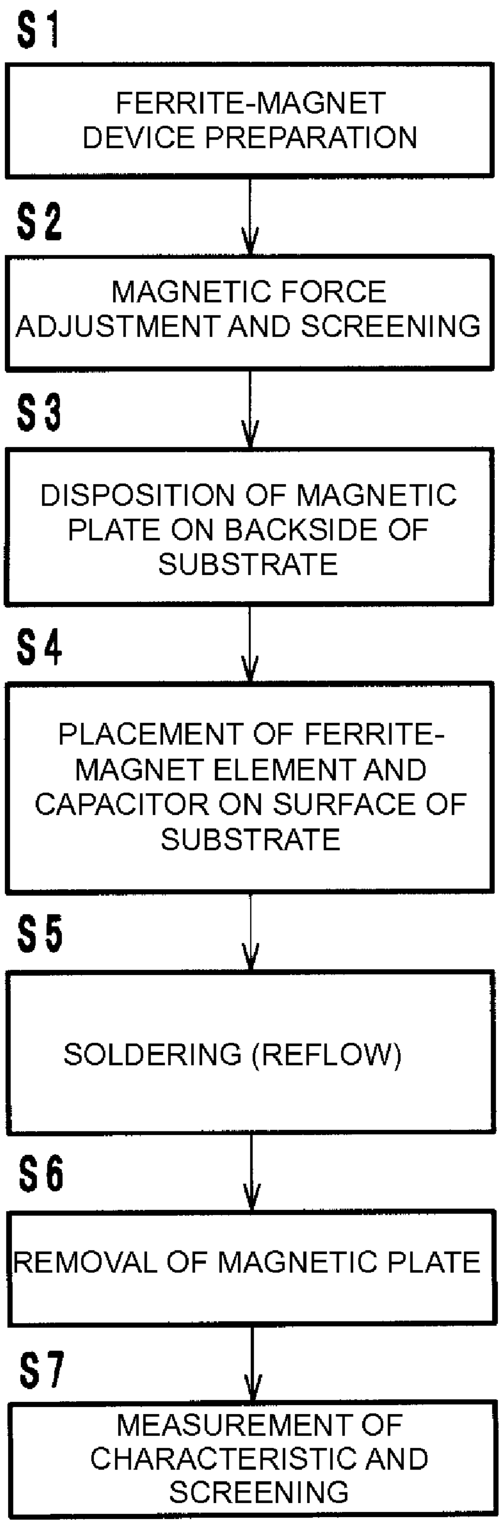
FIG. 6 is a flow chart diagram showing a production process according to a preferred embodiment of the present invention.

The outline of the production process of the above-described isolator 1 will be described below with reference to FIG. 6. The ferrite-magnet device 30 is prepared (Step S1), and magnetic force adjustment and screening of the permanent magnet 41 of the prepared ferrite-magnet device 30 is performed (Step S2). The magnetic force adjustment is performed with respect to the ferrite-magnet device 30, and nonadjustable defective devices are excluded at this time.

A magnetic plate 50 (shown in FIG. 7B) is disposed on the back surface of the substrate 20 (Step S3). Magnetic materials, e.g., iron, nickel, stainless steel, and magnet, are preferably used for the raw material for the magnetic plate 50. Subsequently, the ferrite-magnet device 30 and the capacitor C1 are disposed on the surface of the substrate 20 (Step S4), and soldering is performed in a reflow furnace (Step S5).

Thereafter, the above-described magnetic plate 50 is removed from the back surface of the substrate 20 (Step S6), the characteristics of the isolator 1 are measured (Step S7), and defective devices are excluded at this time.

Figure 7A:
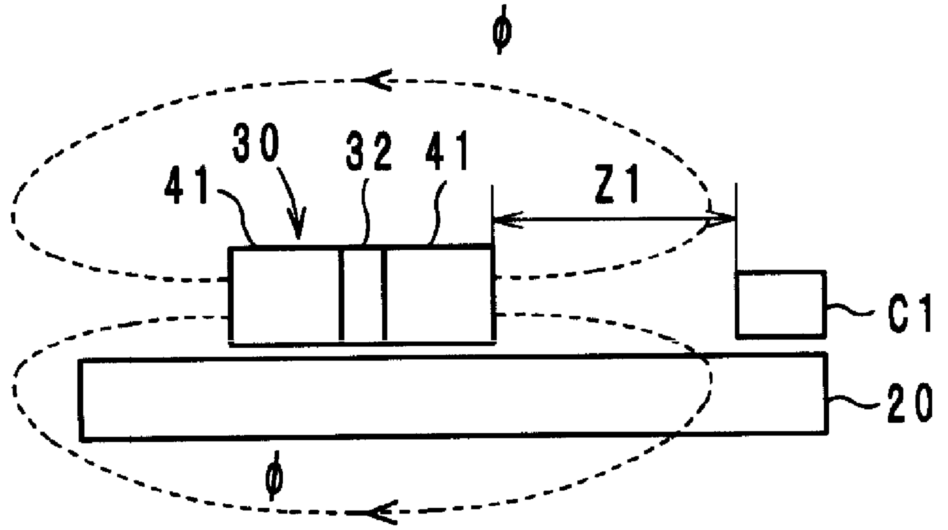
FIG. 7A PRIOR ART
FIGS. 7A and 7B are diagrams showing a leakage magnetic flux of a permanent magnet in mounting.

The operation and effects of the magnetic plate 50 disposed on the back surface of the substrate 20 in an upstream process of the reflow-soldering will be described below. As shown in FIG. 7A, when the reflow-soldering is performed in the state in which the ferrite-magnet device 30 and the capacitor C1 are disposed on the surface of the substrate 20, the leakage magnetic flux $\phi$ of the permanent magnet 41 which has already been magnetized attracts the adjacent capacitor C1. Consequently, the location of the capacitor 1 may be deviated. Thus, it is necessary that the capacitor C1 is disposed at a distance Z1 and, thereby, the size of the isolator 1 must be increased.

Figure 7B:
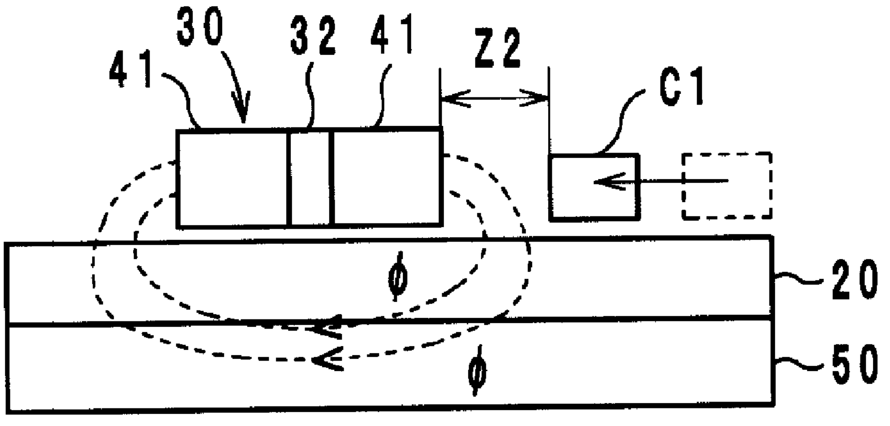

On the other hand, as shown in FIG. 7B, when the magnetic plate 50 is disposed on the back surface of the substrate 20, the leakage magnetic flux $\phi$ from the permanent magnet 41 concentrates on the magnetic plate 50. Consequently, deviations in the location of the capacitor C1 do not occur even when the capacitor C1 is arranged in the close vicinity at a distance of Z2. That is, the devices which are arranged around the ferrite-magnet device 30 and which include magnetic components can be arranged in the close vicinity at a distance Z2, so that the size of the isolator 1 can be greatly reduced.

According to experiments, it was necessary for the distance Z1 to be set at about 0.15 mm in the related art, whereas the distance Z2 could be reduced to about 0.05 mm by using the magnetic plate 50. Since the magnetic plate 50 is removed from the substrate 20 after the mounting of the devices, the addition of an extra component is avoided.

This type of isolator 1 is preferably prepared by a multi-patterning technology, for example. That is, a plurality of ferrite-magnet devices 30 and a plurality of capacitors C1 are arranged in a matrix on a surface of a mother substrate, the ferrite-magnet devices 30 and the capacitors C1 are bonded (e.g., via soldering) while a magnetic plate 50 having an area corresponding to the mother substrate is disposed on the back surface of the mother substrate, and the mother substrate is cut into predetermined units after the magnetic plate 50 is removed.

Figure 8A:
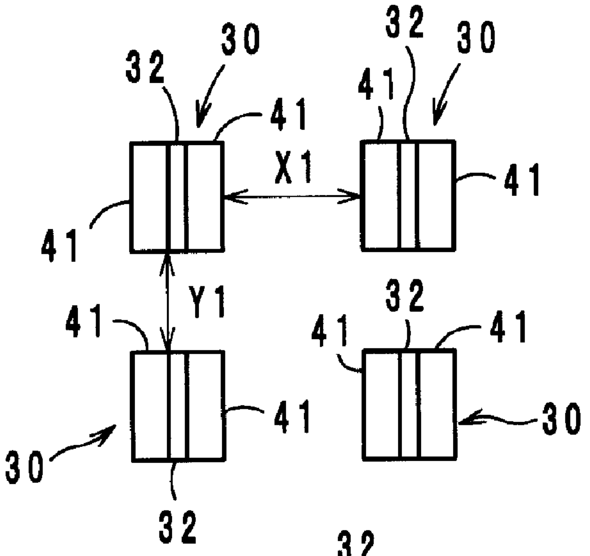
FIG. 8A PRIOR ART
FIGS. 8A and 8B are diagrams showing an arrangement relationship between ferrite-magnet devices in mounting.
Figure 8B:
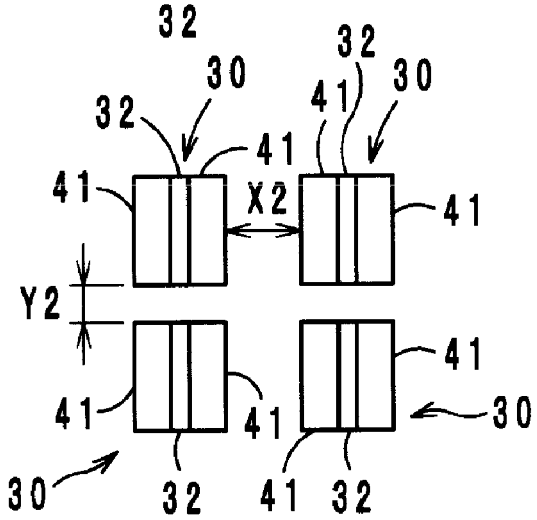

When the ferrite-magnet device 30 is bonded to the mother substrate, the adjacent ferrite-magnet devices 30 are affected by the leakage magnetic flux of the permanent magnet 41. As shown in FIGS. 8A and 8B, when the ferrite-magnet devices 30 were arranged in a matrix on the surface of the mother substrate, minimum distances at which adjacent ferrite-magnet devices 30 were able to be solder-bonded without attraction/repulsion were experimentally determined. As shown in FIG. 8A, when the magnetic plate 50 was not used, the minimum distance X1 was about 1.1 mm, and the minimum distance Y1 was about 0.8 mm. On the other hand, as shown in FIG. 8B, when the magnetic plate 50 was used during the solder-bonding, the minimum distance X2 was reduced to about 0.6 mm, and the minimum distance Y2 was reduced to about 0.3 mm.

Figure 9A:
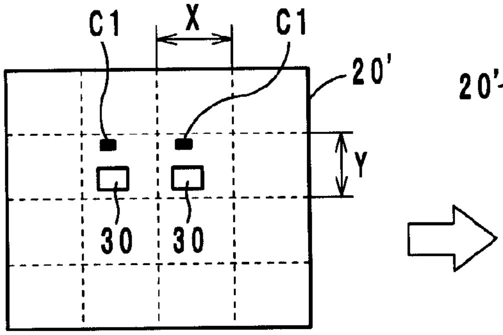
FIG. 9A PRIOR ART
FIGS. 9A and 9B are explanatory diagrams showing an arrangement relationship between a ferrite-magnet device and a matching circuit device in mounting.
Figure 9B:
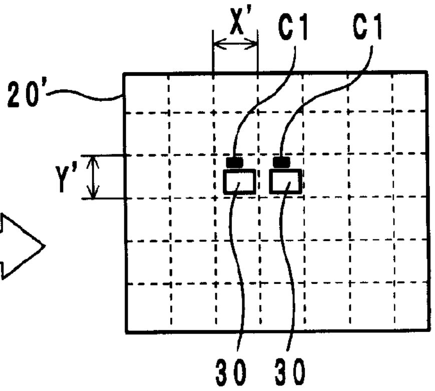

The operation and effects of disposing the magnetic plate 50 on the back surface of the mother substrate during the mounting by soldering is summarized as described below. As shown in FIG. 9A, in the manufacturing method according to the related art, in which the magnetic plate 50 is not used, the length and width dimensions of one isolator unit were X and Y. As shown in FIG. 9B, according to the present example of a preferred embodiment of the present invention in which the magnetic plate 50 was used, the length and width dimensions of one isolator unit were reduced to X' and Y'. In FIGS. 9A and 9B, reference numeral 20' denotes a mother substrate, and a dotted line indicates a cutting line when one isolator unit is cut from the mother substrate.

Second Preferred Embodiment

Figure 10:
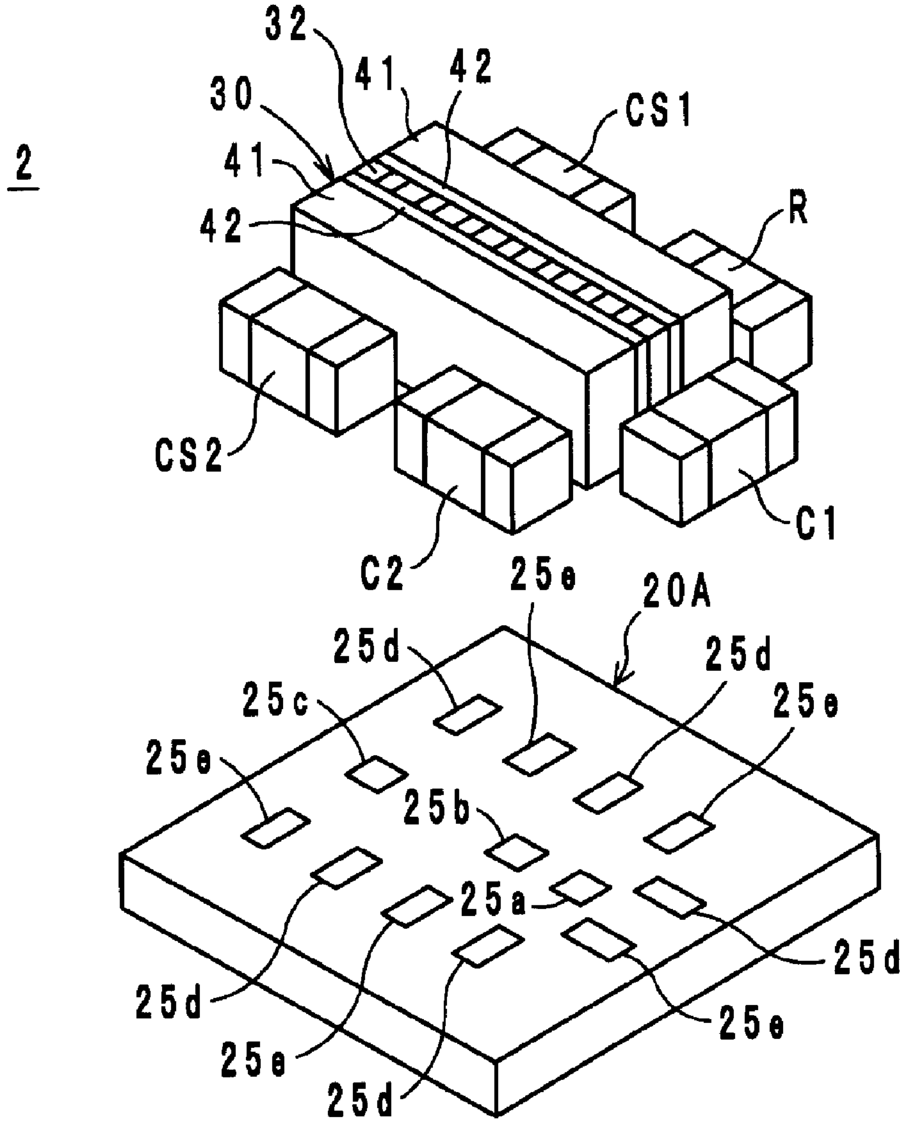
FIG. 10 is an exploded perspective view showing a nonreciprocal circuit device (two-port type isolator) according to a second preferred embodiment of the present invention.

FIG. 10 is an exploded perspective view of a two-port type isolator 2 according to a second preferred embodiment of the present invention. This two-port type isolator 2 has substantially the same configuration as that of the above-described first preferred embodiment and a difference is that all of the matching circuit devices C1, C2, CS1, CS2, and R are chip type devices that are soldered to the surface of a printed circuit board 20A. The surface of the printed circuit board 20A is provided with terminal electrodes 25*d* and 25*e* arranged to connect individual matching circuit devices, in addition to the terminal electrodes 25*a*, 25*b*, and 25*c* arranged to connect both ends of the first and the second center electrodes 35 and 36. Furthermore, input and output electrodes and a ground electrode are also provided, although not shown in the drawing.

In production of the isolator 2, the magnetic plate 50 (refer to FIG. 7B) is disposed on the back surface of the substrate 20A and reflow-soldering of the ferrite-magnet device 30 and the various matching circuit devices to the surface of the substrate 20A is performed. The operation and effects thereof are substantially the same as those described in the above-described first preferred embodiment.

Third Preferred Embodiment

Figure 11:
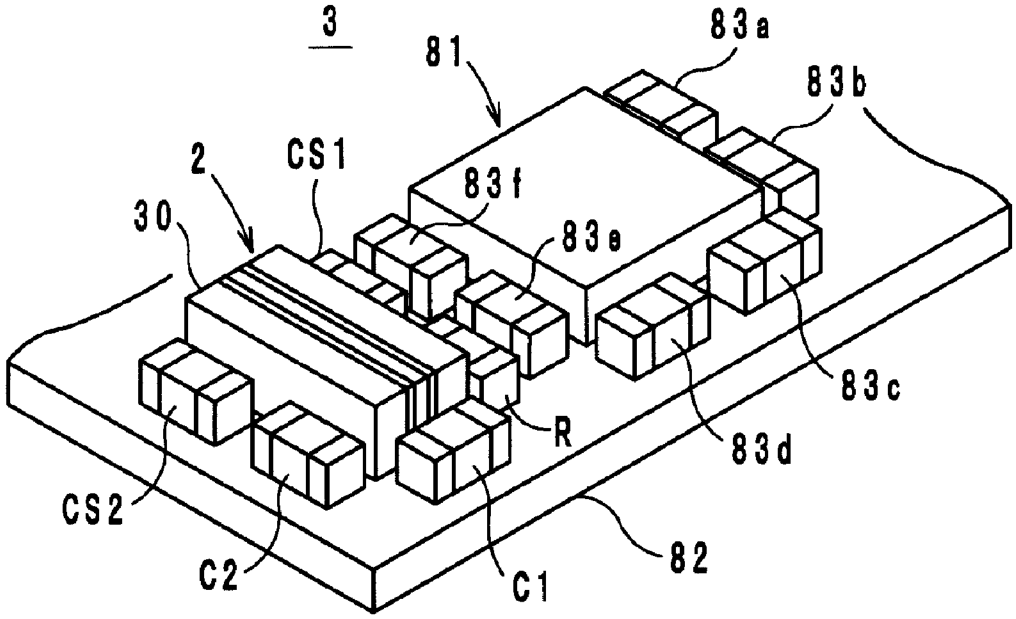
FIG. 11 is a perspective view showing a composite electronic component according to a third preferred embodiment of the present invention.

FIG. 11 shows a composite electronic component 3 according to a third preferred embodiment of the present invention. This composite electronic component 3 defines a module by mounting the above-described isolator 2 and a power amplifier 81 on the surface of a printed circuit board 82. Necessary chip circuit devices 83*a* to 83*f* are also mounted around the power amplifier 81.

Figure 12:
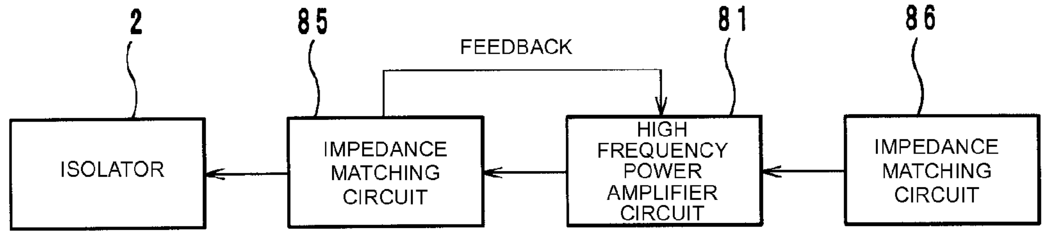
FIG. 12 is a block diagram showing a circuit configuration of the above-described composite electronic component.

FIG. 12 shows a circuit configuration of the composite electronic component 3. The output of an impedance matching circuit 86 is input into the high frequency power amplifier circuit 81, and the output thereof is input into the isolator 2 through an impedance matching circuit 85.

In the production process of the composite electronic component 3, the magnetic plate 50 (refer to FIG. 7B) is disposed on the back surface of the substrate 82 and reflow-soldering of the ferrite-magnet device 30, the power amplifier 81, and the various matching circuit devices to the surface of the substrate 82 is performed. The operation and effects thereof are substantially the same as those described in the above-described first preferred embodiment.

Fourth Preferred Embodiment

Figure 13:
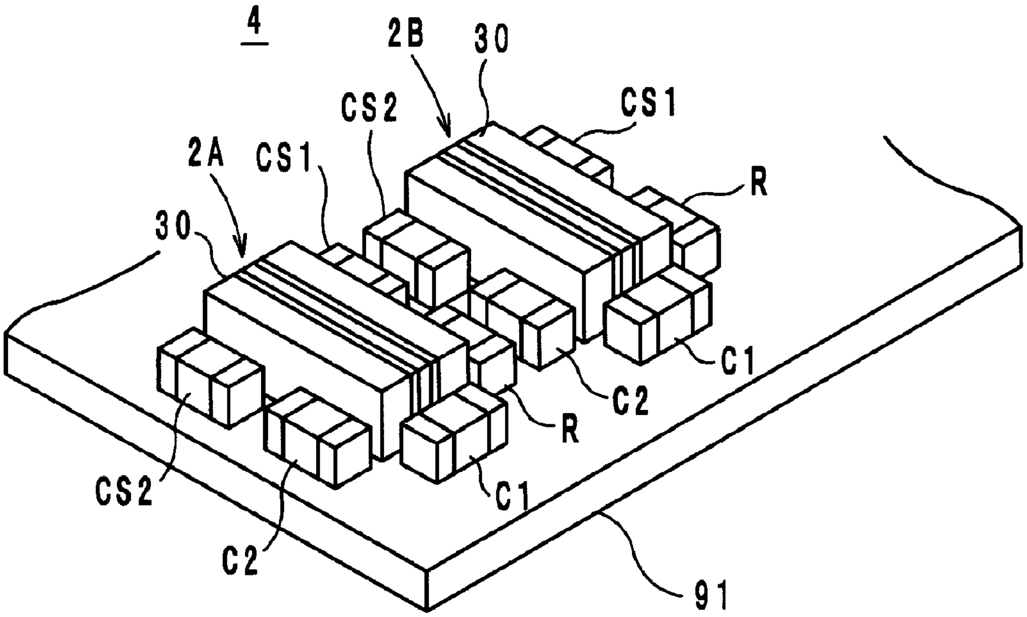
FIG. 13 is a perspective view showing a composite electronic component according to a fourth preferred embodiment of the present invention.

FIG. 13 shows a composite electronic component 4 according to a fourth preferred embodiment of the present invention. This composite electronic component 4 defines a module by mounting isolators 2A and 2B on the surface of a printed circuit board 91. The isolators 2A and 2B have configurations similar to that of the above-described isolator 2. The isolator 2A is preferably used in, for example, approximately the 800 MHz band, and the isolator 2B is preferably used in, for example, approximately the 2 GHz band.

In the production process of the composite electronic component 4, the magnetic plate 50 (refer to FIG. 7B) is disposed on the back surface of the substrate 91 and reflow-soldering of the ferrite-magnet devices 30 and the matching circuit devices to the surface of the substrate 91 is performed. The operation and effects thereof are substantially the same as those described in the above-described first preferred embodiment.

Fifth Preferred Embodiment

Figure 14:
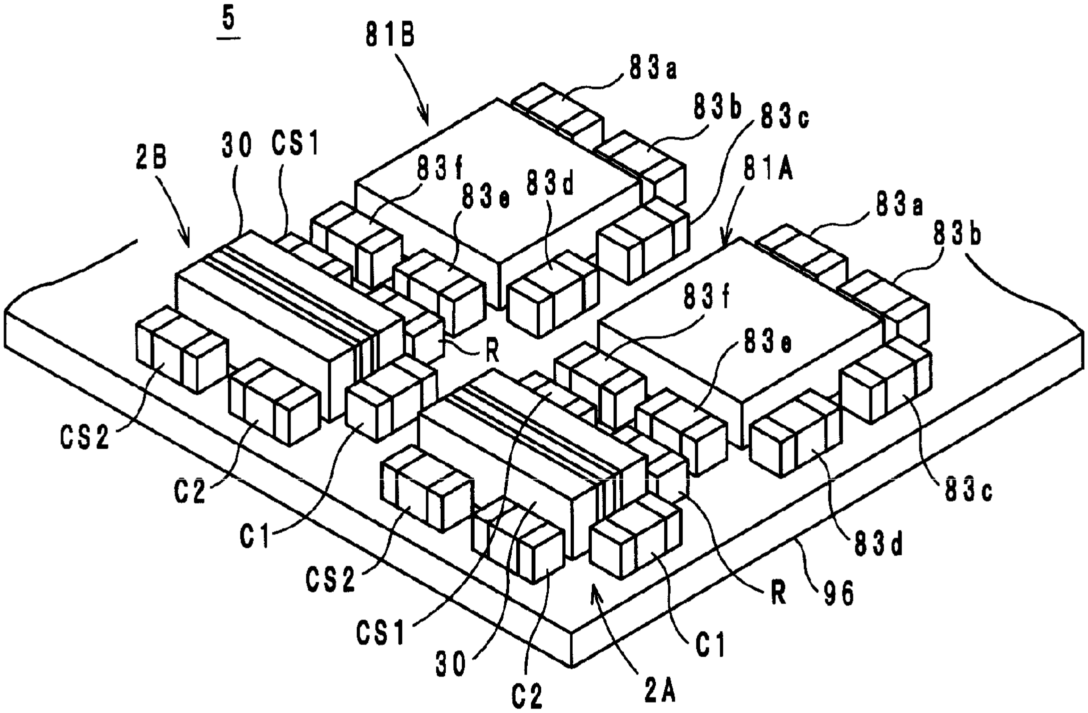
FIG. 14 is a perspective view showing a composite electronic component according to a fifth preferred embodiment of the present invention.

FIG. 14 shows a composite electronic component 5 according to a fifth preferred embodiment of the present invention. This composite electronic component 5 defines a module by mounting a set of the isolator 2A and the power amplifier 81A and a set of the isolator 2B and the power amplifier 81B on the surface of a printed circuit board 96 individually.

In the production process of the composite electronic component 5, the magnetic plate 50 (refer to FIG. 7B) is disposed on the back surface of the substrate 96 and reflow-soldering of the ferrite-magnet devices 30, the power amplifiers 81A and 81B, and the various matching circuit devices to the surface of the substrate 96 is performed. The operation and effects thereof are substantially the same as those described in the above-described first preferred embodiment.

The method for manufacturing a nonreciprocal circuit device and the method for manufacturing a composite electronic component according to the present invention are not limited to the above-described preferred embodiments and can be modified within the scope of the present invention.

In particular, the matching circuit may have any suitable configuration. In the ferrite-magnet device, the ferrite and the permanent magnet may be integrally fired. Furthermore, for the method for bonding the ferrite-magnet device and the matching circuit device to the surface of the substrate, bonding with an electrically conductive adhesive, bonding by ultrasound, or bonding by bridge bonding, for example, may be used, instead of the solder-bonding described in the above-described preferred embodiments.

Moreover, the permanent magnet may be fixed to only one principal surface of the ferrite. The principal surface of the ferrite may be arranged parallel or substantially parallel to the substrate.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for manufacturing a nonreciprocal circuit device comprising the steps of:

providing a ferrite-magnet device including a ferrite which includes a plurality of center electrodes arranged to intersect and to be electrically insulated from each other and a permanent magnet fixed to a principal surface of the ferrite so as to apply a direct current magnetic field to the ferrite;

disposing a magnetic material plate directly on a back surface of a substrate;

bonding the ferrite-magnet device on a front surface of the substrate opposite to the back surface on which the magnetic material plate is disposed after the magnetic material plate is disposed on the back surface of the substrate; and removing the magnetic material plate from the back surface of the substrate after the ferrite-magnet device is bonded on the front surface of the substrate.

2. The method for manufacturing a nonreciprocal circuit device according to claim 1, wherein the bonding is one of bonding by reflow-soldering, bonding with an electrically conductive adhesive, bonding by ultrasound, and bonding by bridge bonding.

3. The method for manufacturing a nonreciprocal circuit device according to claim 1, wherein end electrodes of the center electrodes are disposed on a surface perpendicular or substantially perpendicular to the principal surface of the ferrite, and the end electrodes are bonded to terminal electrodes disposed on the front surface of the substrate.

4. The method for manufacturing a nonreciprocal circuit device according to claim 1, wherein when the ferrite-magnet device is bonded to the front surface of the substrate after the magnetic material plate is disposed on the back surface of the substrate, a matching circuit device is also bonded at the same time to the front surface of the substrate.

5. The method for manufacturing a nonreciprocal circuit device according to claim 1, the method further comprising the steps of:

disposing a plurality of the ferrite-magnet devices in a matrix on a front surface of a mother substrate;

bonding the ferrite-magnet devices after the magnetic material plate is disposed on a back surface of the mother substrate opposite to the front surface of the mother substrate on which the plurality of ferrite-magnet devices are bonded;

removing the magnetic material plate from the back surface of the mother substrate; and cutting the mother substrate into independent units after the magnetic material plate is removed.

* * * * *